(12) United States Patent
Cho et al.

(10) Patent No.: US 8,629,354 B2
(45) Date of Patent: Jan. 14, 2014

(54) PCB HAVING EMBEDDED IC AND METHOD FOR MANUFACTURING THE SAME

(75) Inventors: Shi-Yun Cho, Anyang-si (KR);
Ho-Seong Seo, Suwon-si (KR);
Youn-Ho Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1219 days.

(21) Appl. No.: 12/150,197

(22) Filed: Apr. 25, 2008

(65) Prior Publication Data
US 2008/0273314 A1  Nov. 6, 2008

(30) Foreign Application Priority Data
May 4, 2007 (KR) .................. 10-2007-0043755

(51) Int. Cl.
*H05K 1/11* (2006.01)

(52) U.S. Cl.
USPC ........... 174/262; 174/254; 174/260; 361/718; 361/760; 361/761; 361/763; 29/848

(58) Field of Classification Search
USPC .......... 174/262, 260, 254, 604; 361/718, 760, 361/761, 763; 29/848
See application file for complete search history.

(56) References Cited

U.S. PATENT DOCUMENTS

| | | | | |
|---|---|---|---|---|
| 5,099,309 A | * | 3/1992 | Kryzaniwsky | 361/718 |
| 5,227,338 A | * | 7/1993 | Kryzaniwsky | 29/841 |
| 5,280,192 A | * | 1/1994 | Kryzaniwsky | 257/723 |
| 5,386,342 A | * | 1/1995 | Rostoker | 361/749 |
| 5,831,836 A | * | 11/1998 | Long et al. | 361/820 |
| 5,843,808 A | * | 12/1998 | Karnezos | 438/121 |
| 6,171,888 B1 | * | 1/2001 | Lynch et al. | 438/123 |
| 6,770,822 B2 | * | 8/2004 | Pasternak et al. | 174/260 |
| 6,909,054 B2 | * | 6/2005 | Sakamoto et al. | 174/260 |
| 7,074,696 B1 | * | 7/2006 | Frankowsky et al. | 438/464 |
| 7,078,806 B2 | * | 7/2006 | Khan et al. | 257/734 |
| 7,174,631 B2 | * | 2/2007 | Hsu et al. | 29/848 |
| 7,285,728 B2 | * | 10/2007 | Sunohara et al. | 174/260 |
| 7,307,852 B2 | * | 12/2007 | Inagaki et al. | 361/760 |
| 7,351,915 B2 | * | 4/2008 | Ahn et al. | 174/260 |
| 7,435,910 B2 | * | 10/2008 | Sakamoto et al. | 174/260 |
| 7,449,363 B2 | * | 11/2008 | Hsu | 438/106 |
| 7,485,489 B2 | * | 2/2009 | Bjobell | 438/106 |
| 7,498,249 B2 | * | 3/2009 | Miyazaki et al. | 438/597 |
| 7,505,282 B2 | * | 3/2009 | Chang | 361/761 |
| 2006/0049995 A1 | * | 3/2006 | Imaoka et al. | 343/702 |

(Continued)

FOREIGN PATENT DOCUMENTS

| | | | | |
|---|---|---|---|---|
| JP | 10-294563 | 11/1998 | | H05K 3/46 |
| JP | 2005-310946 | 11/2005 | | H01L 23/12 |
| JP | 2006-339466 | 12/2006 | | H01L 25/18 |

*Primary Examiner* — Xiaoliang Chen
(74) *Attorney, Agent, or Firm* — Cha & Reiter, LLC.

(57) ABSTRACT

A multi-layer PCB includes a plurality of insulating layers and a plurality of conductive pattern layers alternatively and repeatedly stacked; contact-hole formed in the insulating layers so as to allow electrical connection through the contact-holes; a first integrated circuit arranged in a first insulating layer as one of the insulating layers so as to be embedded in the multi-layer PCB, the first integrated circuit having a plurality of connection bumps for electric connection on an upper surface of the first integrated circuit; and a second integrated circuit stacked on a lower surface of the first integrated circuit, the second integrated circuit having a plurality of connection bumps for electric connection on an upper surface of the second integrated circuit.

4 Claims, 12 Drawing Sheets

(56) References Cited

U.S. PATENT DOCUMENTS

| | | |
|---|---|---|
| 2006/0115931 A1* | 6/2006 | Hsu .............................. 438/121 |
| 2006/0128069 A1* | 6/2006 | Hsu .............................. 438/124 |
| 2006/0131746 A1* | 6/2006 | Kohara et al. ................. 257/737 |
| 2006/0145328 A1* | 7/2006 | Hsu .............................. 257/690 |
| 2006/0220167 A1* | 10/2006 | Min et al. ...................... 257/499 |
| 2007/0020907 A1* | 1/2007 | Miyazaki et al. ............. 438/597 |
| 2007/0108610 A1* | 5/2007 | Kondo .......................... 257/737 |
| 2007/0141759 A1* | 6/2007 | Nagase et al. ................ 438/126 |
| 2007/0262441 A1* | 11/2007 | Chen ............................. 257/706 |
| 2008/0101044 A1* | 5/2008 | Chang .......................... 361/761 |
| 2008/0192450 A1* | 8/2008 | Tuominen et al. ........... 361/761 |

\* cited by examiner

PCB HAVING EMBEDDED IC AND METHOD FOR MANUFACTURING THE SAME

CLAIM OF PRIORITY

This application claims the benefit of the earlier filing date, pursuant to 35 USC 119(a), to that patent application entitled "PCB Having Embedded IC And Method For Manufacturing The Same," filed in the Korean Intellectual Property Office on May 4, 2007 and assigned Serial No. 2007-43755, the contents of which are hereby incorporated by reference.

BACKGROUND OF THE INVENTION

1. Field of the Invention

The present invention relates to a multi-layer printed circuit board (multi-layer PCB), and more particularly to a PCB having an embedded integrated circuit (IC) and method for manufacturing the same.

2. Description of the Related Art

A printed circuit board (PCB) has been employed in various electric appliances. Particularly, a multi-layer PCB having a structure including insulating layers and conductive patterns layer repeatedly and alternately stacked on each other has been applied to electric appliances of super-slimness/super-small size, such as a portable terminal, a desktop computer, etc.

FIG. 1 is a view illustrating a multi-layer PCB according to the conventional art.

As shown in FIG. 1, the conventional multi-layer PCB has a structure including a plurality of insulating layers 30~34 and a plurality of conductive pattern layers 40~45 alternately stacked, and a plurality of contact-holes (via holes) 50 formed in the insulating layers 30~34, and an integrated embedded circuit board 10. The integrated circuit 10 is disposed in an interior of a core insulating layer 30 among the insulating layers 30~34, and has a plurality of bumps 11 for electric connection to external devices, and an insulating layer 12 on a surface thereof.

However, the conventional multi-layer PCB has only one embedded integrated circuit, and cannot have a plurality of embedded integrated circuits.

FIG. 2 is a view illustrating a multi-layer PCB according to the conventional art. The multi-layer PCB has two integrated circuits 10 and 20 arranged side by side, which are embedded in a core insulating layer 30.

However, the conventional multi-layer PCB as shown in FIG. 2 has two integrated circuits arranged side by side so that there is a disadvantage in that the whole size (area) thereof is too large.

FIG. 3 is a view illustrating a conventional multi-layer PCB according to the conventional art. Two PCBs are manufactured, which have core insulating layers 30 and 30-1 having embedded printed circuits 10 and 20, respectively, and then the two core insulating layers are again manufactured as one PCB through a lamination process.

However, the conventional multi-layer PCB as shown in FIG. 3 uses two core insulating layers and has an insulating layer interposed between them so as to connect the two core insulating layers with each other. Therefore, there is a disadvantage in that the whole thickness of the multi-layer PCB is too thick.

SUMMARY OF THE INVENTION

The present invention provides a PCB having an embedded integrated circuit, which can realize size-reduction as well as slimness of the PCB when more than two integrated circuits are embedded therein.

Also, the present invention provides a PCB having an embedded integrated circuit, which can realize size-reduction as well as slimness of the PCB when more than two integrated circuits are embedded therein.

In accordance with an aspect of the present invention, a multi-layer PCB includes: a plurality of insulating layers and a plurality of conductive pattern layers alternatively and repeatedly stacked; contact-holes formed in the insulating layers so as to allow electrical connection through the contact-holes; a first integrated circuit arranged in a first insulating layer as one of the insulating layers so as to be embedded in the multi-layer PCB, the first integrated circuit having a plurality of connection bumps for electric connection on an upper surface of the first integrated circuit; and a second integrated circuit stacked on a lower surface of the first integrated circuit, the second integrated circuit having a plurality of connection bumps for electric connection on an upper surface of the second integrated circuit. The multi-layer PCB further includes a conductive pattern layer disposed between a lower surface of the first integrated circuit and a lower surface of the second integrated circuit. The first insulating layer is a core insulating layer.

In accordance with another aspect of the present invention, a method of manufacturing a multi-layer PCB, includes forming a first conductive pattern layer and a second conductive pattern layer on upper and lower surfaces of a first insulating layer, respectively, forming a first hole for receiving a first integrated circuit in the first insulating layer by removing the first conductive pattern layer of a predetermined area for receiving the first integrated circuit and the first insulating layer; arranging the first integrated circuit in the first hole in such a manner that a lower surface of the first integrated circuit makes contact with the second conductive pattern layer; stacking a second insulating layer and a third conductive pattern layer on the first conductive pattern layer and an upper surface of the first integrated circuit; attaching an adhesive tape on the second conductive pattern layer of a predetermined area for receiving a second integrated circuit; stacking a third insulating layer and a fourth conductive pattern layer on the second conductive pattern layer including the adhesive tape; cutting the fourth conductive pattern layer and the third insulating layer along a rim of the adhesive tape; forming a second hole for receiving the second integrated circuit in the third insulating layer by removing the adhesive tape, the third insulating layer formed on the adhesive tape, and the fourth conductive pattern layer; arranging the second integrated circuit in the second hole in such a manner that a lower surface of the second integrated circuit makes contact with the second conductive pattern layer; stacking a fourth insulating layer and a fifth conductive pattern layer on the fourth conductive pattern layer and an upper surface of the second integrated circuit; and forming a plurality of contact-holes in the second insulating layer and the fourth insulating layer so as to allow inter-layer electric connection.

The core insulating layer may be material of FR4, and the second to fourth insulating layers may be made from an ajinomoto build-up film (ABF).

The method of manufacturing a multi-layer PCB further includes: stacking a fifth insulating layer, a sixth insulating layer, a sixth conductive pattern layer, and a seventh conductive pattern layer on a lower part of the second insulating layer and an upper part of the fourth insulating layer; and forming a plurality of contact-holes in the fifth insulating layer and the sixth insulating layer so as to allow inter-layer electric connection.

In accordance with another aspect of the present invention, a method of manufacturing a multi-layer PCB includes the steps of: forming a first conductive pattern layer on an upper surface of a first insulating layer, and then forming a first hole for receiving a first integrated circuit on the first insulating layer by removing the first conductive pattern layer of a predetermined area for receiving the first integrated circuit and the first insulating layer; attaching a first adhesive tape having a size equal to a size of a predetermined area for receiving a second integrated circuit on a lower surface of the first insulating layer so as to block off the first hole; arranging the first integrated circuit in the first hole in such a manner that a lower surface of the first integrated circuit is attached to the first adhesive tape; stacking a second insulating layer and a third conductive pattern layer on the first conductive pattern layer and an upper surface of the first integrated circuit; stacking a third insulating layer and a third conductive pattern layer on the second conductive pattern layer including the first adhesive tape; cutting the third conductive pattern layer and the second insulating layer along a rim of the first adhesive tape; forming a second hole for receiving the second integrated circuit in the third insulating layer by removing the first adhesive tape, the third insulating layer formed on the first adhesive tape, and the third conductive pattern layer; arranging the second integrated circuit in the second hole in such a manner that a lower surface of the second integrated circuit makes contact with a lower surface of the first integrated circuit; stacking a fourth insulating layer and a fourth conductive pattern layer on the third conductive pattern layer and an upper surface of the second integrated circuit; and forming a plurality of contact-holes in the second insulating layer and the fourth insulating layer so as to allow inter-layer electric connection.

The method of manufacturing a multi-layer PCB further includes: stacking a fifth insulating layer, a sixth insulating layer, a fifth conductive pattern layer, and a sixth conductive pattern layer on a lower part of the second insulating layer and an upper part of the fourth insulating layer; and forming a plurality of contact-holes in the fifth insulating layer and the sixth insulating layer so as to allow inter-layer electric connection.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Exemplary embodiments of the present invention are now described with reference to the accompanying drawings. For the purposes of clarity and simplicity, a detailed description of known functions and configurations incorporated herein will be omitted as it may make the subject matter of the present invention rather unclear.

Figure 1:
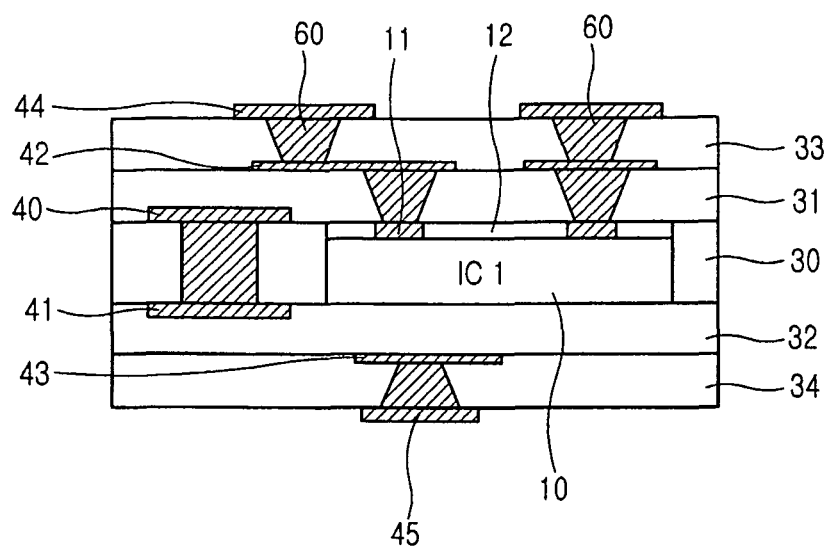
FIG. 1 is a view illustrating a multi-layer PCB according to a conventional art.
Figure 2:
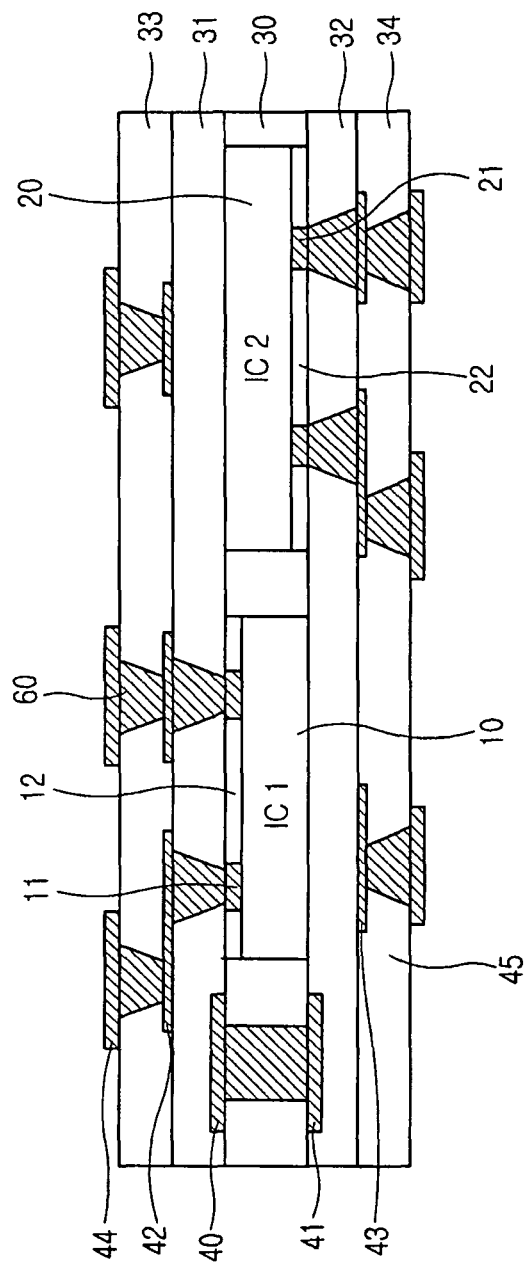
FIG. 2 is another view illustrating a multi-layer PCB according to conventional art.
Figure 3:
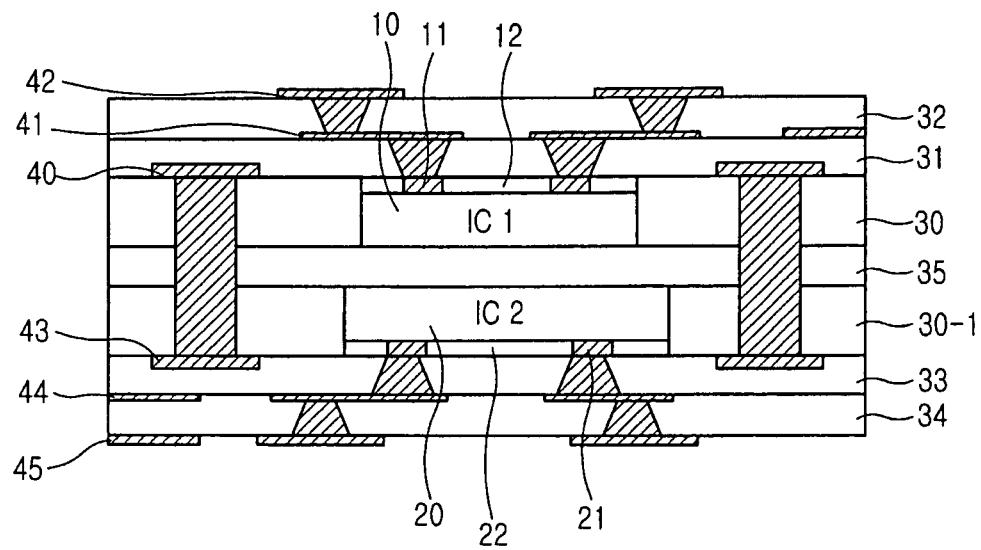
FIG. 3 is another view illustrating a multi-layer PCB according to conventional art.
Figure 4:
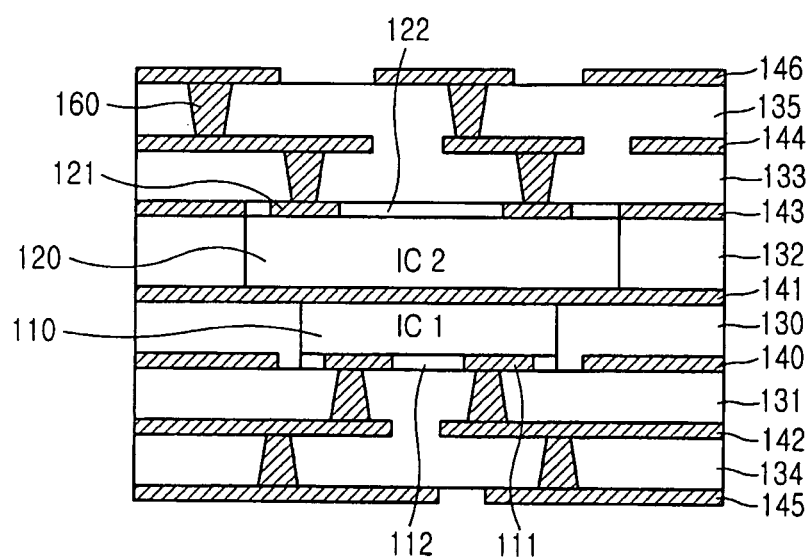
FIG. 4 is a sectional view illustrating the construction of a multi-layer PCB according to one embodiment of the present invention.

FIG. 4 is a sectional view illustrating the construction of a multi-layer PCB 100 according to one embodiment of the present invention.

Referring to FIG. 4, the multi-layer PCB 100 according to the present embodiment has a structure including a plurality of insulating layers 130~135 and a plurality of conductive pattern layers 140~146 alternatively stacked and two insulating layers 130 and 132 adjacent to each other among the insulating layers 130~135 having integrated circuits 110 and 120 which are embedded (laid, received) therein, respectively. Also, the insulating layers 130~135 have a plurality of contact-holes (via holes 160) for allowing inter-layer electric connection, and two conductive pattern layers adjacent to each other are electrically connected with each other through the contact-holes.

The integrated circuits 110 and 120 have a plurality of connection bumps 111 and 121 for electric connection to external devices and insulating layers 112 and 122 formed on an upper surface thereof. The integrated circuits 110 and 120 are stacked while having a conductive pattern layer 141 formed between them. At this time, the integrated circuits 110 and 120 are arranged in such a manner that rear surfaces (the other surfaces) of the respective integrated circuits face each other.

In the multi-layer PCB 100 according to the present embodiment, two insulating layers 130 and 132, which have embedded integrated circuits 110 and 120, respectively, are stacked adjacently to each other while having a conductive pattern layer 141 disposed between them. Therefore, the multi-layer PCB 100 can have a smaller thickness in comparison with a structure including two core insulating layers stacked while having a conventional conductive layer disposed between them.

FIGS. 5A to 5L are views illustrating a process of manufacturing the above-described multi-layer PCB of FIG. 4.

Figure 5A:
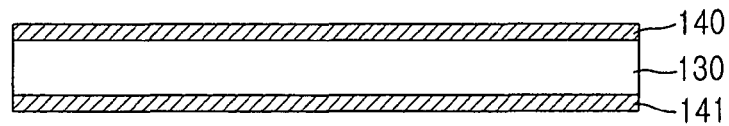
FIGS. 5A to 5L are sectional views illustrating a process of manufacturing a multi-layer PCB according to one embodiment of the present invention.

FIG. 5A shows a process of coating conductive pattern layers 140 and 141 on upper and lower surfaces of a core insulating layer 130. For example, a core insulating layer 130 having material of FR4 is prepared, the upper and lower surfaces of the core insulating layer 130 are coated by a copper foil, and then the copper foil is patterned through a typical photolithography process. Accordingly, the first and second conductive pattern layers 140 and 141 can be formed. The conductive pattern layers may be made of metal material such as tin, chromium, titan, nickel, zinc, cobalt, gold, etc. as well as copper.

Figure 5B:
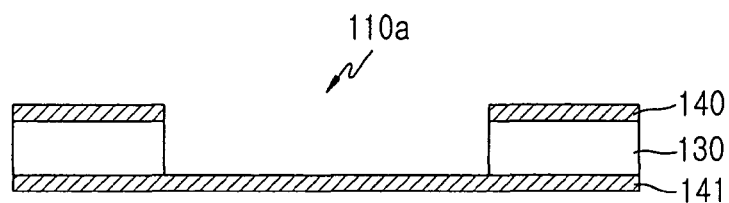

FIG. 5B shows a process of forming a hole 110a for receiving the first integrated circuit on the core insulating layer 130. The hole 110a can be formed by perforating the first conductive pattern layer 140 coated on the upper surface of the core insulating layer (the first insulating layer) 130 and the core insulating layer 130 through a typical drilling process. The hole 110a has a plan equal to the plan of an integrated circuit received therein, and has a size larger than the integrated circuit.

Figure 5C:
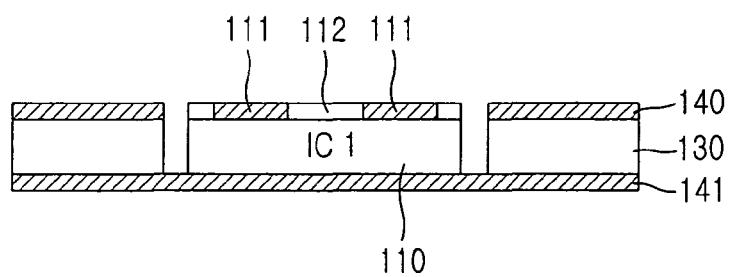

FIG. 5C shows a process of arranging the first integrated circuit 110 in the hole in such a manner that a lower surface (rear surface) of the first integrated circuit 110 makes contact with the second conductive pattern layer 141. The first integrated circuit 110 has a plurality of connection bumps 111 for electric connection to external devices and an insulating layer 112, which are disposed on the upper surface thereof.

Figure 5D:
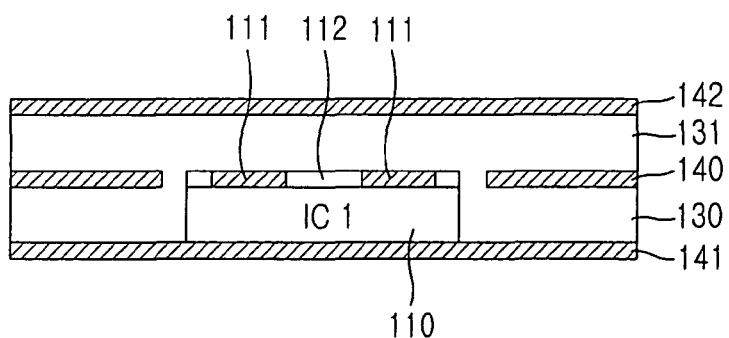

FIG. 5D shows a process of building-up the second insulating layer 131 and the third conductive pattern layer 142 on the whole upper surface of the first integrated circuit 110 after arranging the first integrated circuit 110 in the hole. The second insulating layer 131 can be formed through a typical lamination process, for example, through deposition of an insulating layer made from an ajinomoto build-up film (ABF). The third conductive pattern layer 142 is coated by a copper foil and then can be patterned through a typical photolithography process, similar to the first and second conductive pattern layers 140 and 141.

Figure 5E:
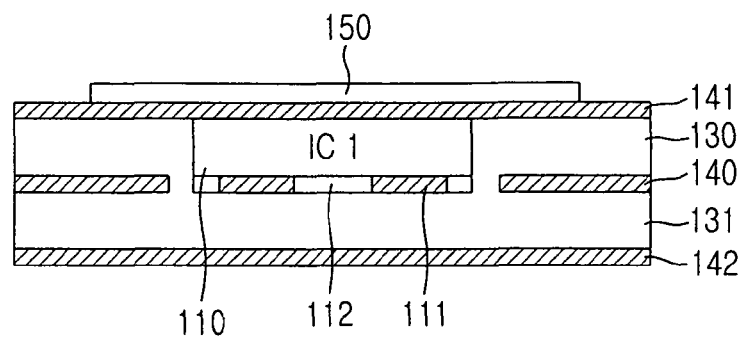

FIG. 5E shows a process of attaching an adhesive tape 150 on the second conductive pattern layer 141 making contact with the lower surface of the first integrated circuit 110. The adhesive tape 150 is used to make it easier to form a hole for receiving the second integrated circuit in a subsequent process. Therefore, the adhesive tape 150 is attached while having a size large enough to receive the second integrated circuit. The adhesive tape 150 can be easily attached or detached as necessary.

Figure 5F:
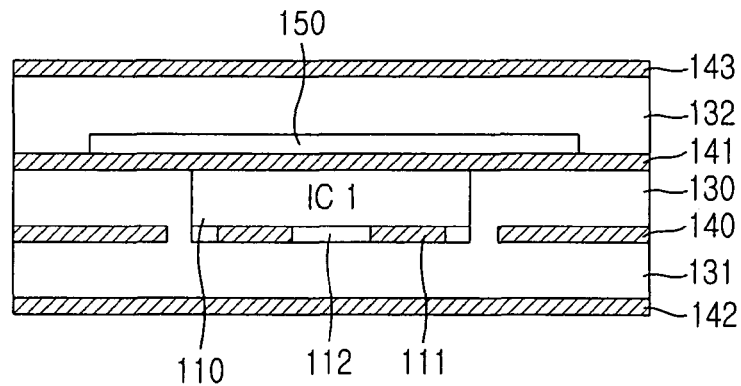

FIG. 5F shows a process of building-up the third insulating layer 132 and the fourth conductive pattern layer 143 on the upper surface of the second conductive pattern layer 141 including an upper part of the adhesive tape 150.

The third insulating layer 132 can be formed through a typical lamination process, for example, through deposition of an insulating layer made from an ajinomoto build-up film (ABF). The third conductive pattern layer 142 is coated by a copper foil, and then can be patterned through a typical photolithography process, similar to the first and second conductive pattern layers 140 and 141.

Figure 5G:
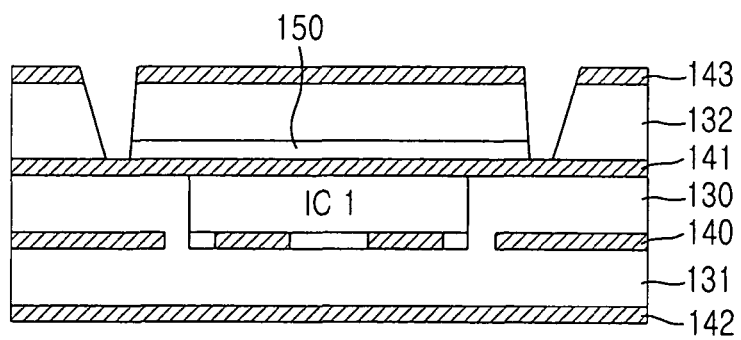

FIG. 5G shows a process of cutting a rim (edge) of the second hole 120a when forming the second hole 120a for receiving the second integrated circuit on the third insulating layer 132. The rim of the second hole 120a can be cut by perforating the fourth conductive pattern layer 143 and the third insulating layer 132 through a typical drilling process.

Figure 5H:
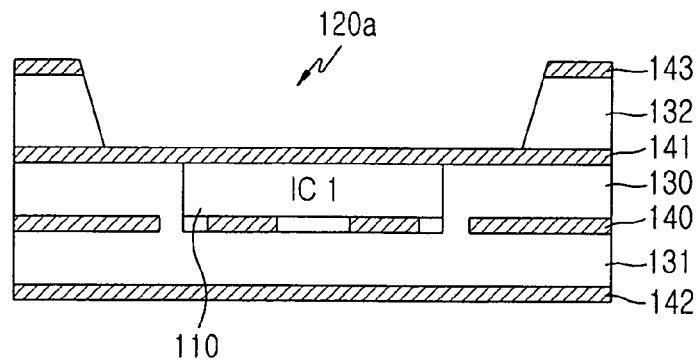

FIG. 5H shows a process of forming the second hole 120a for receiving the second integrated circuit in the third insulating layer 132 by removing the adhesive tape 150, the third insulating layer 132 formed on the adhesive tape 150, and the fourth conductive pattern layer 143. By taking off the adhesive tape 150, the third insulating layer 132 and the fourth conductive pattern layer 143, which are disposed at the upper part of the adhesive tape 150, can be simultaneously removed. Accordingly, the second hole 120a can be easily formed. The second hole 120a has a plan equal to the plan of an integrated circuit received therein, and has a size larger than that of the integrated circuit.

Figure 5I:
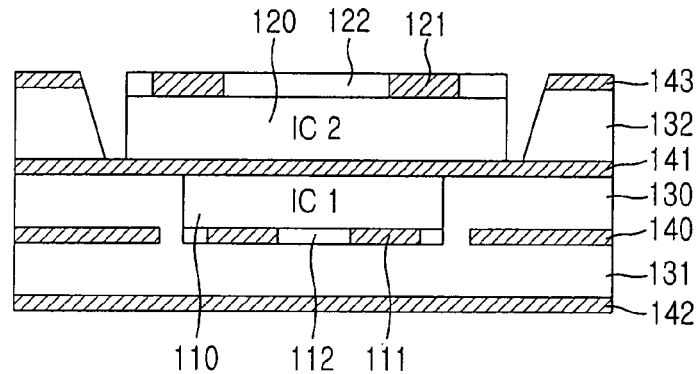

FIG. 5I shows a process of arranging the second integrated circuit 120 in the second hole 120a in such a manner that the lower surface (rear surface) of the second integrated circuit 120 makes contact with the second conductive pattern layer 141. The second integrated circuit 120 has a plurality of connection bumps 121 for electric connection to external devices and an insulating layer 122 on an upper surface thereof.

Figure 5J:
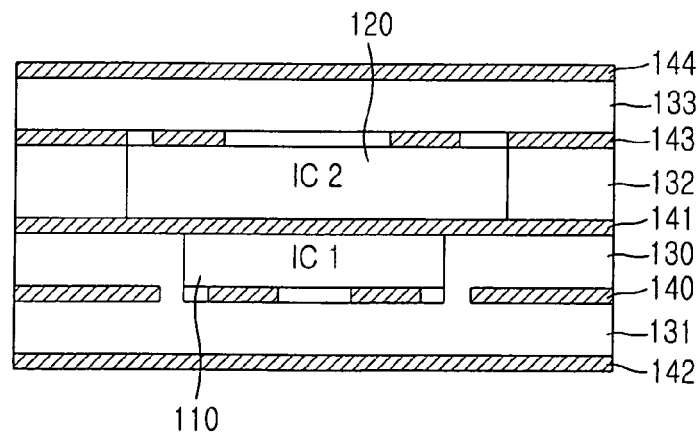

FIG. 5J shows a process of arranging the second integrated circuit 120 in the hole, and then building-up the fourth insulating layer 133 and the fifth conductive pattern layer 144 on the upper part of the second integrated circuit 120. The fourth insulating layer 133 can be formed through a typical lamination process, for example, through deposition of an insulating layer made from an ajinomoto build-up film (ABF). The fifth conductive pattern layer 144 is coated by a copper foil, and then can be patterned through a typical photolithography process, in a manner similar to that of the first to fourth conductive pattern layers 140~143.

Figure 5K:
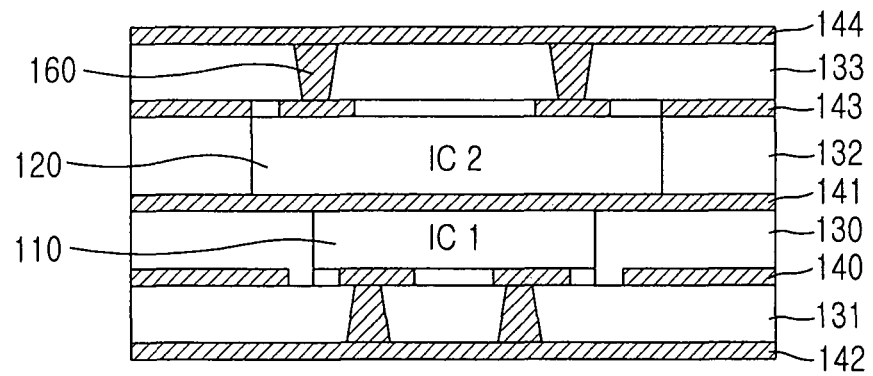

FIG. 5K shows a process of forming a plurality of contact-holes 160 for allowing inter-layer electric connection in the second insulating layer 131 and the fourth insulating layer 133. For example, the contact-hole 160 can be formed through a photolithography process. The photolithography process includes a process of applying photoresist (not shown) on the third and fifth conductive pattern layers 142 and 144, a process of exposing a predetermined contact-hole forming area by using a mask so as to allow a photoresist pattern to be engraved thereon, a process of developing the exposed area, and process of etching the third and fifth conductive pattern layers 142 and 144 and the second and fourth insulating layers 131 and 133 by using the remaining photoresist.

Figure 5L:
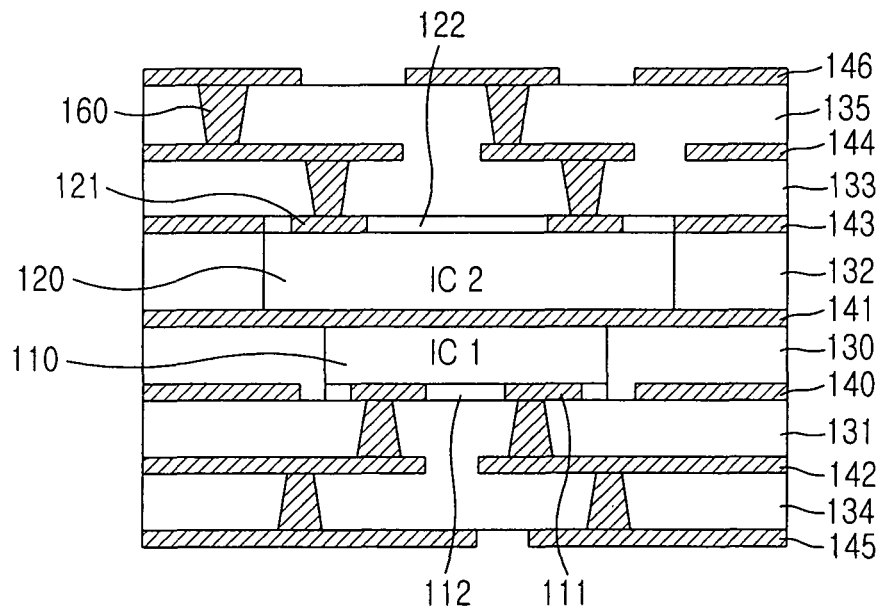

FIG. 5L shows a process of building-up the fifth and sixth insulating layers 134 and 135, and the sixth and seventh conductive pattern layers 145 and 146 on the lower part of the second insulating layer 131 and the upper part of the fourth insulating layer 133, and then forming a plurality of contact-holes 160 for allowing inter-layer electric connection in the fifth insulating layer 134 and the sixth insulating layer 135. The fifth and sixth insulating layers 134 and 135 can be formed by depositing an insulating layer through a typical lamination process (e.g., an ajinomoto build-up film (ABF), in a manner similar to that of the second to fourth insulating layers 131~133. The sixth and seventh conductive pattern layers 145 and 146 are coated by a copper foil, and then can be patterned through a typical photolithography process, as the first to fifth conductive pattern layers 140~144 are.

Figure 6:
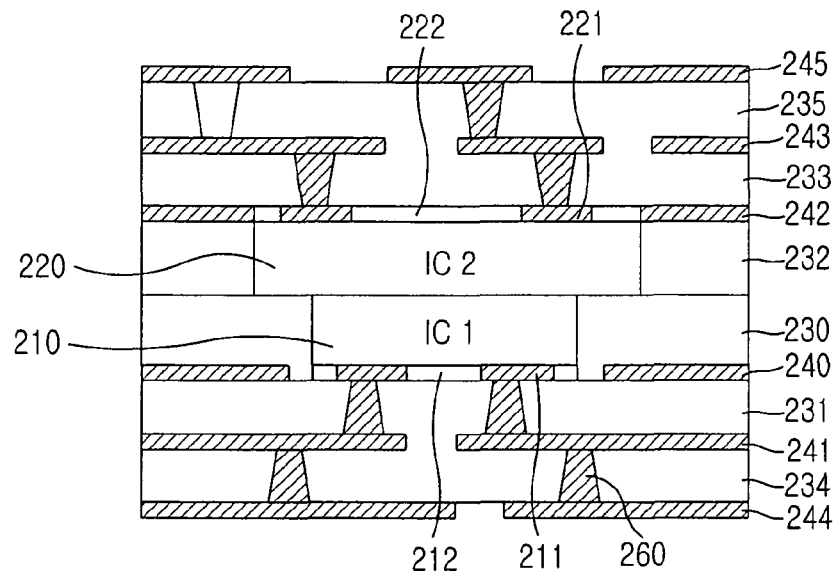
FIG. 6 is a sectional view illustrating the construction of a multi-layer PCB according to another embodiment of the present invention.

FIG. 6 is a sectional view illustrating the construction of a multi-layer PCB 200 according to another embodiment of the present invention.

Referring to FIG. 6, the multi-layer PCB 200 according to the present embodiment has a structure including a plurality of insulating of layers 230~235 and a plurality of conductive pattern layers 240~245 alternatively stacked, and includes an insulating mono-layer having two integrated circuits 210 and 220 embedded (laid, received) therein. Also, a plurality of insulating layers 230~235 have a plurality of contact-holes (via holes 260) for allowing inter-layer electric connection, and two conductive pattern layers adjacent to each other are electrically connected with each other through the contact-holes.

The integrated circuits 210 and 220 have a plurality of connection bumps 211 and 221 for electric connection to external devices and insulating layers 212 and 222, which are formed on an upper surface thereof. The integrated circuits 210 and 220 are stacked in such a manner that rear surfaces (surfaces of the other side) of the respective integrated circuits make contact with each other.

In the multi-layer PCB 200 according to the present embodiment, two integrated circuits 210 and 220 are stacked in such a manner that their rear surfaces make contact with each other so that they are arranged in an insulating mono-layer (referred to as an insulating mono-layer because a conductive pattern layer isn't interposed between the insulating layers 230 and 232 and two insulating layers make contact with each other). Therefore, the multi-layer PCB 200 has a smaller thickness in comparison with a conventional structure including an integrated circuit arranged in two core insulating layers and an insulating layer interposed between the two layers.

FIGS. 7A to 7M are views illustrating a method for manufacturing the above-described multi-layer PCB as shown in FIG. 6.

Figure 7A:
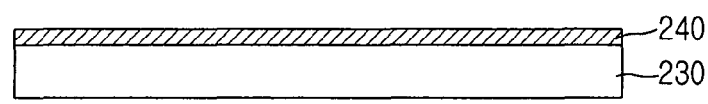
FIGS. 7A to 7M are cross-sectional views illustrating a process of manufacturing a multi-layer PCB according to another embodiment of the present invention.

FIG. 7A shows a process of coating a conductive pattern layer 240 on an upper surface of a core insulating layer (the first insulating layer) 230. For example, a core insulating layer 230 having material of FR4 is prepared, an upper surface of the core insulating layer 230 is coated by a copper foil, and then the copper foil is patterned through a typical photolithography process. Accordingly, the first conductive pattern layer 240 can be formed.

Figure 7B:
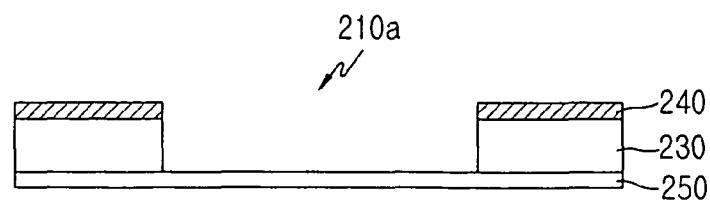

FIG. 7B shows a process for forming a hole 210a for receiving the first integrated circuit on the core insulating layer 230, and then attaching the first adhesive tape 250 for supporting the integrated circuit on a lower surface of the core insulating layer 230. The hole 210a can be formed by perforating the first conductive pattern layer 240 coated on the upper surface of the core insulating layer (the first insulating layer) 230 and the core insulating layer 230 through a typical drilling process. The hole 210a has a plan equal to a plan of an integrated circuit received therein, and has a size larger than the integrated circuit. The lower part of the hole 210a is blocked off by the first adhesive tape 250, and the first adhesive tape 250 can be easily attached or detached as necessary.

Figure 7C:
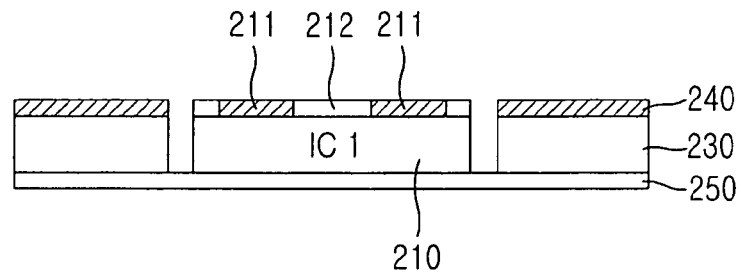

FIG. 7C shows a process of arranging the first integrated circuit 210 in the hole in such a manner that the lower surface (rear surface) of the first integrated circuit 210 makes contact with the first adhesive tape 250. The first integrated circuit 210 has a plurality of connection bumps 211 for electric connection to external devices and an insulating layer 212 on an upper surface thereof.

Figure 7D:
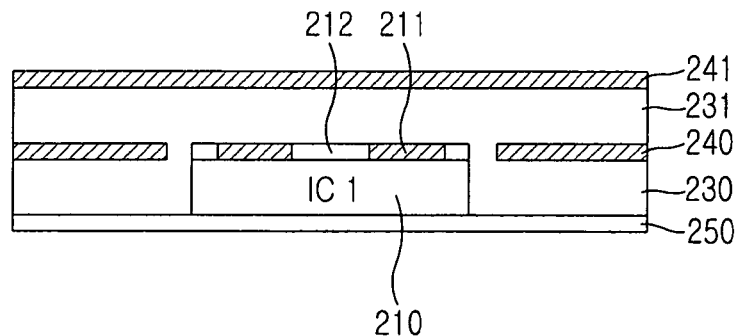

FIG. 7D shows a process of arranging the first integrated circuit 210 in the hole, and then building-up the second insulating layer 231 and the second conductive pattern layer 241 on whole upper part of the first integrated circuit 210. The second insulating layer 231 can be formed through a typical lamination process, for example, through deposition of an insulating layer made from an ajinomoto build-up film (ABF). The second conductive pattern layer 141 is coated by a copper foil, and then can be patterned through a typical photolithography process, similarly to the first conductive pattern layer 140.

Figure 7E:
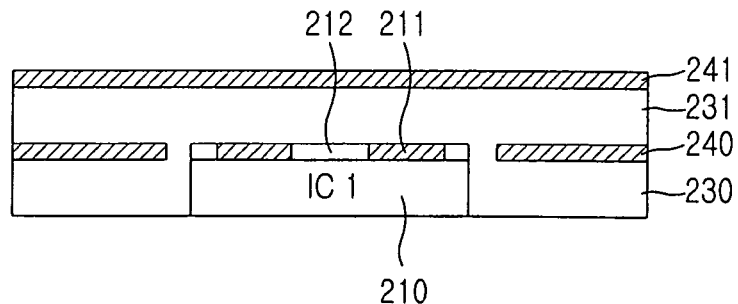

FIG. 7E is a process of removing the first adhesive tape 250 attached on the lower part of the core insulating layer 230.

Figure 7F:
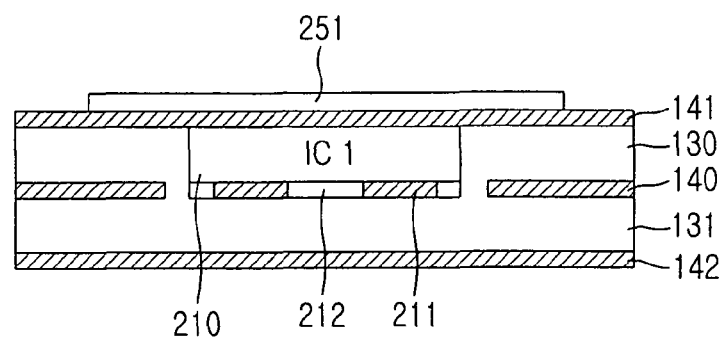

FIG. 7F is a process of attaching the second adhesive tape 251 on the lower surface of the first integrated circuit 210 and a part of the core insulating layer 230. The second adhesive tape 251 is used to make it easier to form a hole for receiving the second integrated circuit to be formed in a subsequent process. The second adhesive tape 251 is attached while having a size large enough to receive the second integrated circuit. The second adhesive tape 251 can be easily attached or detached. Meanwhile, in the present embodiment, the first adhesive tape 250 is attached to the whole lower surface of the core insulating layer 230 in step 7b, and then the first integrated circuit 210 is arranged on the first adhesive tape 250. Then, the first adhesive tape 250 is removed in the step 7e, and then the second adhesive tape 251 is again attached in step 7f. However, if the core insulating layer and the integrated circuit can be stably fixed, the process of attaching or detaching the first adhesive tape can be omitted, and the second adhesive tape used in order to form a hole for receiving the second integrated circuit can be directly attached.

Figure 7G:
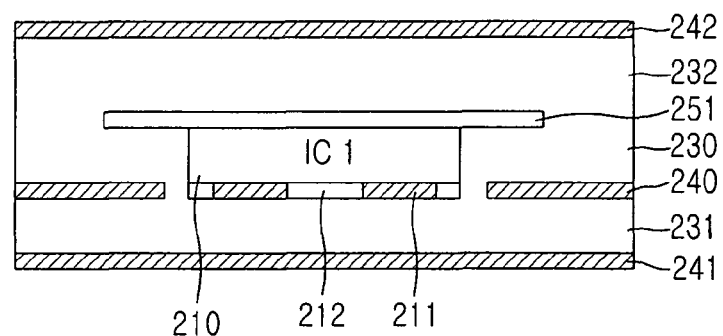

FIG. 7G shows a process of building-up the third insulating layer 232 and the third conductive pattern layer 242 on whole upper surface of the core insulating layer 230, including an upper part of the second adhesive tape 251. The third insulating layer 232 can be formed through a typical lamination process such as an ajinomoto build-up film (ABF) process. The third conductive pattern layer 242 is coated by a copper foil, and then can be patterned through a typical photolithography process, similar to the first and second conductive pattern layers 240 and 241.

Figure 7H:
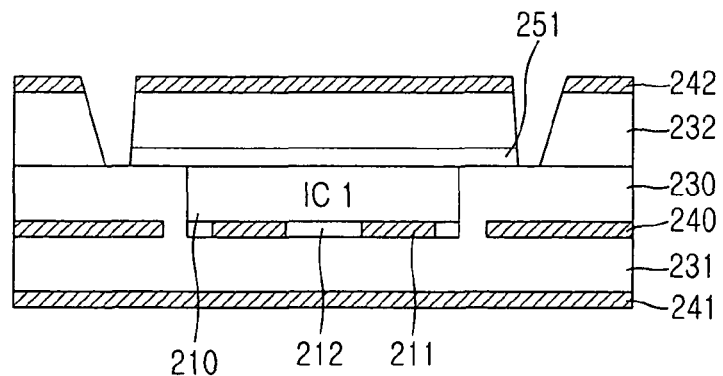

FIG. 7H shows a process of cutting a rim (edge) of the hole 220a for forming the second hole 220a for receiving the second integrated circuit on the third insulating layer 232. The rim of the second hole 220a can be cut by perforating the third conductive pattern layer 242 of an edge of the second adhesive tape 251 and the third insulating layer 232 through a typical drilling process. The hole 110a has a plan equal to the plan of an integrated circuit received therein, and has a size larger than the integrated circuit.

Figure 7I:
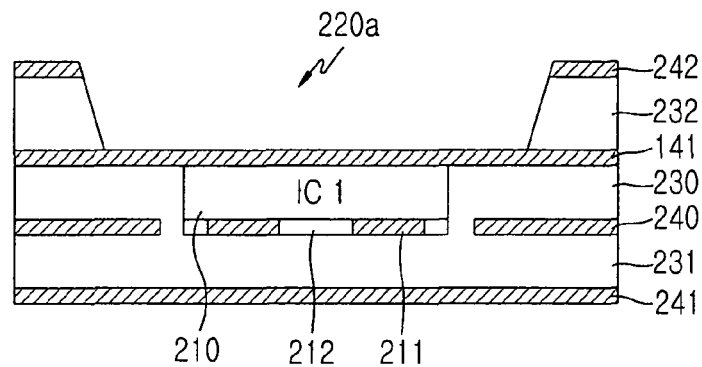

FIG. 7I illustrates a process of forming a hole 220a for receiving the second integrated circuit on the third insulating layer 232 by removing the second adhesive tape 251 the third insulating layer 232 formed on the second adhesive tape 251, and the third conductive pattern layer 242. By taking off the adhesive tape 251, the third insulating layer 232 and the third conductive pattern layer 242 can be simultaneously removed. Accordingly, the second hole 220a can be easily formed. The hole 210a has a plan equal to the plan of an integrated circuit received therein, and has a size larger than the integrated circuit.

Figure 7J:
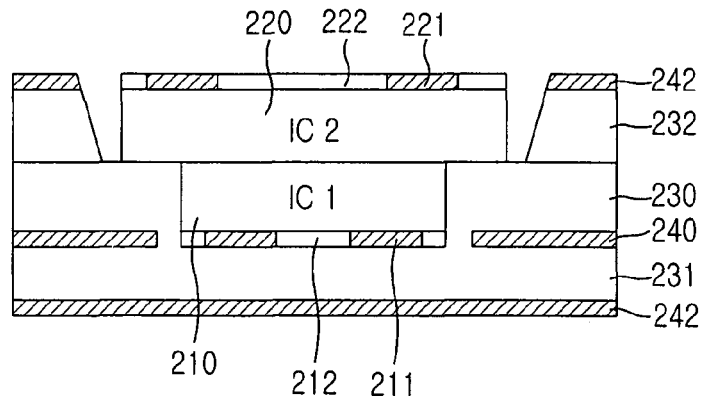

FIG. 7J shows a process of arranging the second integrated circuit 220 in the second hole in such a manner that the lower surface (rear surface) of the second integrated circuit 220 makes contact with the lower surface of the first integrated circuit 210 and the core insulating layer 230. The second integrated circuit 220 has a plurality of connection bumps 221 for electric connection to external devices and an insulating layer 222 on an upper surface thereof.

Figure 7K:
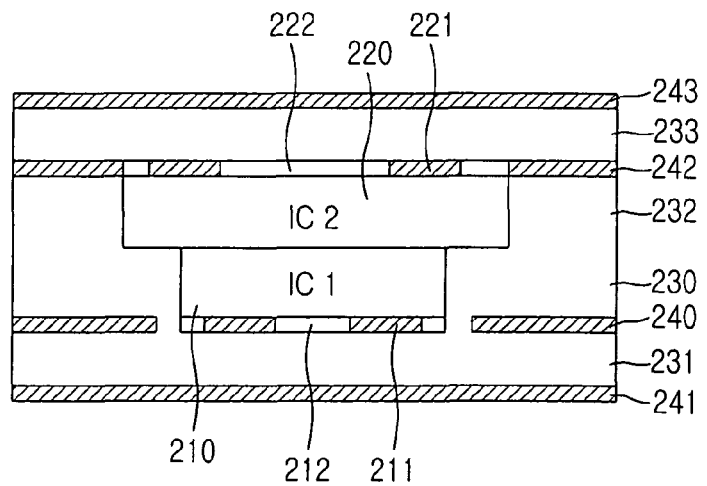

FIG. 7K shows a process of building-up the fourth insulating layer 233 and the fourth conductive pattern layer 243 on the upper part of the second integrated circuit 220 after arranging the second integrated circuit 220 in the hole. The fourth insulating layer 233 can be formed through a typical lamination process, such as an ajinomoto build-up film (ABF). The fourth conductive pattern layer 243 is coated by a copper foil, and then can be patterned through a typical photolithography process, similar to the first to third conductive pattern layers 240~243.

Figure 7L:
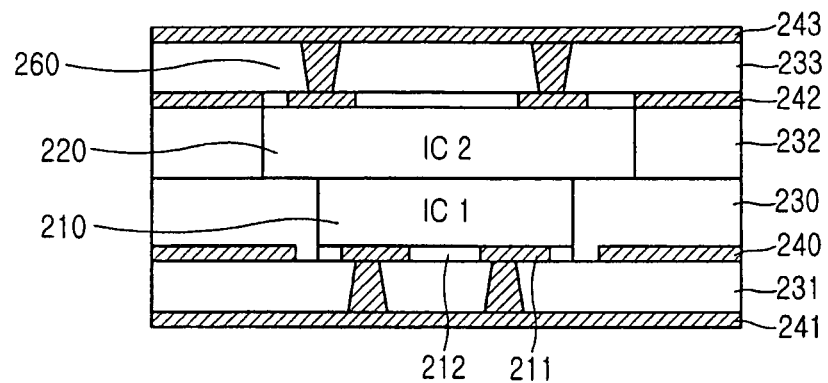

FIG. 7L shows a process of forming a plurality of contact-holes 260 for allowing inter-layer electric connection in the second insulating layer 231 and the fourth insulating layer 233. For example, the contact-hole 260 can be formed through a photolithography process. The photolithography process includes a process of applying photoresist (not shown) on the second and fourth conductive pattern layers 241 and 243, a process of exposing a predetermined contact-hole forming area by using a mask so as to allow a photoresist pattern to be engraved thereon, a process of developing the exposed part, and process of etching the second and fourth conductive pattern layers 241 and 243 and the second and fourth insulating layers 231 and 233 by using remaining photoresist.

Figure 7M:
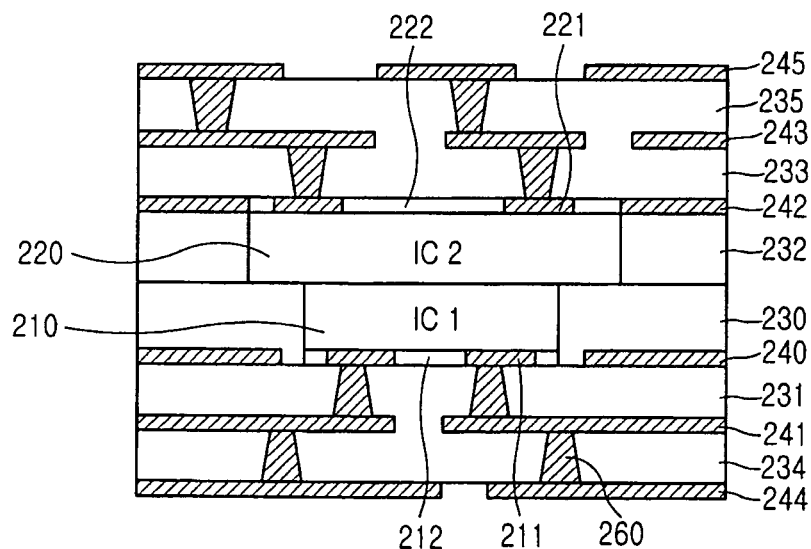

FIG. 7M shows a process of building-up the fifth and sixth insulating layers 234 and 235, and the fifth and sixth conductive pattern layers 244 and 245 on the lower part of the second insulating layer 231 and the upper part of the fourth insulating layer 233, respectively, and then forming a plurality of contact-holes 260 for electric connection to external devices in fifth insulating layer 234 and the sixth insulating layer 235. The fifth and sixth insulating layers 234 and 235 can be formed through a typical lamination process, for example, an ajinomoto build-up film (ABF), similar to the second to fourth insulating layers 231~233. The fifth and sixth conductive pattern layers 244 and 245 are coated by a copper foil and then can be patterned through a typical photolithography process, similar to the first to fourth conductive pattern layers 240~243.

While the invention has been shown and described with reference to certain exemplary embodiments thereof, it will be understood by those skilled in the art that various changes in form and details may be made therein without departing from the spirit and scope of the invention. For example, the number of embedded integrated circuits, the number or material of insulating layers and conductive pattern layers can be changed as necessary. Accordingly, the scope of the invention is not to be limited by the above-described embodiments but by the claims and the equivalents thereof.

As described above, in the multi-layer PCB according to an embodiment of the present invention, because two insulating layers having an embedded integrated circuit, are stacked adjacently to each other while having a conductive pattern layer disposed between them, the multi-layer PCB can be a smaller thickness thereof in comparison with a conventional structure including two core insulating layers stacked while having a conductive layer disposed between them.

Moreover, in the multi-layer PCB according to another embodiment of the present invention, because two integrated circuits are stacked in such a manner that respective rear surfaces thereof make contact with each other so as to be arranged in an insulating mono-layer, it can be possible to further reduce the thickness of the multi-layer PCB in comparison with a conventional structure where an integrated circuit is arranged in two core insulating layers, and then an insulating layer is interposed between them Furthermore, in a method for manufacturing a multi-layer PCB according to the present invention, an easily attachable or detachable adhesive tape is attached on the lower part of a predetermined area for receiving an integrated circuit, an insulating layer and a conductive pattern layer are formed thereon, and then the insulating layer formed on the adhesive tape and the conductive pattern layer are removed through a lift-off process. Therefore, a hole for receiving an integrated circuit can be easily formed.

What is claimed is:

1. A method for manufacturing a multi-layer PCB, comprising:

forming a first conductive pattern layer and a second conductive pattern layer on upper and lower surfaces of a first insulating layer, respectively;

forming a first hole for receiving a first integrated circuit in the first insulating layer by removing the first conductive pattern layer of a predetermined area;

arranging the first integrated circuit in the first hole so that a lower surface of the first integrated circuit makes direct contact with the second conductive pattern layer without an insulating layer therebetween;

stacking a second insulating layer and a third conductive pattern layer on the first conductive pattern layer and an upper surface of the first integrated circuit;

attaching an adhesive tape on the second conductive pattern layer of a predetermined area for receiving a second integrated circuit;

stacking a third insulating layer and a fourth conductive pattern layer on the second conductive pattern layer including the adhesive tape;

cutting the fourth conductive pattern layer and the third insulating layer along a rim of the adhesive tape;

forming a second hole for receiving the second integrated circuit in the third insulating layer by taking off the adhesive tape so that the third insulating layer and the fourth conductive pattern layer, which are disposed at the upper part of the adhesive tape, are simultaneously removed;

arranging the second integrated circuit in the second hole in such a manner that a lower surface of the second integrated circuit makes direct contact with the second conductive pattern layer without an insulating layer therebetween;

stacking a fourth insulating layer and a fifth conductive pattern layer on the fourth conductive pattern layer and an upper surface of the second integrated circuit; and forming a plurality of contact-holes in the second insulating layer and the fourth insulating layer so as to allow inter-layer electric connection.

2. The method as claimed in claim 1, wherein the first insulating layer is a core insulating layer.

3. The method as claimed in claim 2, wherein the core insulating layer is an FR4 material, and the second to fourth insulating layers may be made from an ajinomoto build-up film (ABF).

4. The method as claimed in claim 1, further comprising:

stacking a fifth insulating layer, a sixth insulating layer, a sixth conductive pattern layer, and a seventh conductive pattern layer, respectively, on a lower part of the second insulating layer and an upper part of the fourth insulating layer; and forming a plurality of contact-holes in the fifth insulating layer and the sixth insulating layer so as to allow inter-layer electric connection.

* * * * *